US012615808B2

(12) United States Patent
Lee

(10) Patent No.: US 12,615,808 B2
(45) Date of Patent: Apr. 28, 2026

(54) SEMICONDUCTOR DEVICE AND METHOD OF MANUFACTURING SEMICONDUCTOR DEVICE

(71) Applicant: SK hynix Inc., Gyeonggi-do (KR)

(72) Inventor: Nam Jae Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 364 days.

(21) Appl. No.: 18/347,560

(22) Filed: Jul. 6, 2023

(65) Prior Publication Data

US 2024/0321948 A1 Sep. 26, 2024

(30) Foreign Application Priority Data

Mar. 21, 2023 (KR) ........................ 10-2023-0036759

(51) Int. Cl.
| | |
|---|---|
| *H10D 62/10* | (2025.01) |
| *H10D 64/01* | (2025.01) |
| *H10D 64/23* | (2025.01) |
| *H10D 64/27* | (2025.01) |
| *H10D 84/83* | (2025.01) |
| *H10D 30/01* | (2025.01) |

(52) U.S. Cl.
CPC ........... *H10D 62/10* (2025.01); *H10D 64/018* (2025.01); *H10D 64/254* (2025.01); *H10D 64/513* (2025.01); *H10D 84/83* (2025.01); *H10D 30/027* (2025.01)

(58) Field of Classification Search
CPC .... H10D 30/0215; H10D 62/10; H10D 84/83; H10D 30/027; H10D 30/0275; H10D 64/018

See application file for complete search history.

(56) References Cited

U.S. PATENT DOCUMENTS

| | | | |
|---|---|---|---|
| 11,450,741 B2 | 9/2022 | Liu et al. | |
| 2018/0096885 A1* | 4/2018 | Chan | H01L 21/28518 |
| 2022/0109071 A1* | 4/2022 | Togo | H10D 30/0227 |
| 2022/0262627 A1* | 8/2022 | Ko | H01L 21/31111 |

FOREIGN PATENT DOCUMENTS

| | | |
|---|---|---|
| KR | 10-0558011 B1 | 3/2006 |
| KR | 10-2006-0126032 A | 12/2006 |

* cited by examiner

*Primary Examiner* — Wasiul Haider
(74) *Attorney, Agent, or Firm* — IP & T GROUP LLP

(57) ABSTRACT

A semiconductor device may include a silicide gate electrode that is disposed over a substrate, a first epitaxial pattern that protrudes from the substrate, a second epitaxial pattern that protrudes from the substrate, a silicide source contact that is connected to the substrate through the first epitaxial pattern and that is disposed at a level different from a level of the silicide gate electrode, and a silicide drain contact that is connected to the substrate through the second epitaxial pattern and that is disposed at a level different from the level of the silicide gate electrode.

17 Claims, 12 Drawing Sheets

SEMICONDUCTOR DEVICE AND METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2023-0036759 filed on Mar. 21, 2023, which is incorporated herein by reference in its entirety.

BACKGROUND

1. Technical Field

Embodiments disclosed herein relate to an electronic device and, more particularly, to a semiconductor device and a method of manufacturing a semiconductor device.

2. Related Art

The degree of integration of semiconductor devices is basically determined by the area that is occupied by a unit memory cell. As the degree of integration of semiconductor devices in which a memory cell is formed on a substrate as a single layer recently reaches its limit, a three-dimensional semiconductor device in which memory cells are stacked on a substrate has been considered. In order to improve operation reliability and an operating speed of such a three-dimensional semiconductor device, various structures and manufacturing methods are under development.

SUMMARY

In one embodiment, a semiconductor device may include a silicide gate electrode that is disposed over a substrate, a first epitaxial pattern that protrudes from the substrate, a second epitaxial pattern that protrudes from the substrate, a silicide source contact that is connected to the substrate through the first epitaxial pattern and that is disposed at a first level different from a top level of the silicide gate electrode, and a silicide drain contact that is connected to the substrate through the second epitaxial pattern and that is disposed at a second level different from the top level of the silicide gate electrode.

In another embodiment, a semiconductor device may include a silicide gate electrode that is disposed over a substrate and that is made of a silicide material, an insulating spacer that surrounds a sidewall of the silicide gate electrode and that has a height different from a height of the silicide gate electrode, a first epitaxial pattern that is disposed on the substrate and that has a greater height than the silicide gate electrode, a second epitaxial pattern that is disposed on the substrate and that has a greater height than the silicide gate electrode, a silicide source contact that is disposed on the first epitaxial pattern, and a silicide drain contact that is disposed on the second epitaxial pattern.

In another embodiment, a method of manufacturing a semiconductor device may include forming a sacrificial pattern on a substrate, growing a first epitaxial pattern to protrude from the substrate, growing a second epitaxial pattern to protrude from the substrate, forming a silicide gate electrode by siliciding the sacrificial pattern, forming a silicide source contact that is disposed at a first level different from a top level of the silicide gate electrode by siliciding the first epitaxial pattern, and forming a silicide drain contact that is disposed at a second level different from the top level of the silicide gate electrode by siliciding the second epitaxial pattern.

In another embodiment, a method of manufacturing a semiconductor device may include forming, over a substrate, a gate pattern including a sacrificial pattern and a hard mask pattern, forming a spacer on a sidewall of the gate pattern, growing a first epitaxial pattern to protrude from the substrate, growing a second epitaxial pattern to protrude from the substrate, exposing the sacrificial pattern by removing the hard mask pattern, and substituting the sacrificial pattern with a silicide gate electrode.

DETAILED DESCRIPTION

Hereinafter, embodiments according to the technical scope of the present disclosure are described with reference to the accompanying drawings.

One embodiment of the present disclosure provides a semiconductor device and a method of manufacturing a semiconductor device, which have a stable structure and improved characteristics.

Parasitic capacitance of a transistor can be reduced, and junction leakage can be improved. Accordingly, a characteristic of the transistor, such as ring oscillator delay (ROD), can be improved. A process of manufacturing a semiconductor device can be improved, and a manufacturing cost can be reduced.

Figure 1:
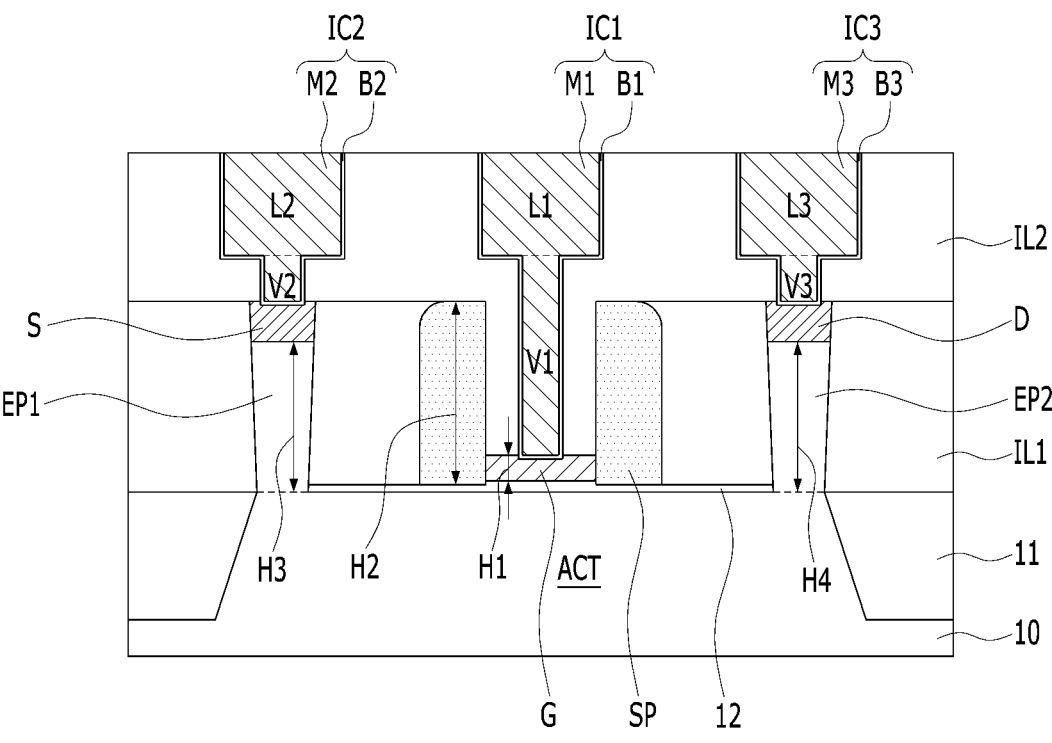
FIG. 1 is a cross-sectional view illustrating a structure of a semiconductor device according to one embodiment of the present disclosure.

FIG. 1 is a cross-sectional view illustrating a structure of a semiconductor device according to one embodiment of the present disclosure.

Referring to FIG. 1, a semiconductor device may include a substrate 10, a silicide gate electrode G, a silicide source contact S, and a silicide drain contact D. The semiconductor device may further include an isolation layer 11, a gate insulating layer 12, a first epitaxial pattern EP1, a second epitaxial pattern EP2, a spacer SP, a first interlayer insulating layer IL1, a second interlayer insulating layer IL2, a first interconnection structure IC1, a second interconnection structure IC2, and a third interconnection structure IC3. Alternatively, the semiconductor device may further include at least one of the isolation layer 11, the gate insulating layer 12, the first epitaxial pattern EP1, the second epitaxial pattern EP2, the spacer SP, the first interlayer insulating layer IL1, the second interlayer insulating layer IL2, the first interconnection structure IC1, the second interconnection structure IC2, and the third interconnection structure IC3.

The silicide gate electrode G may be disposed over the substrate 10. The isolation layer 11 may be disposed within the substrate 10. An active area ACT may be defined by the isolation layer 11. The silicide gate electrode G may be disposed on the active area ACT of the substrate 10. The gate insulating layer 12 may be disposed on the active area ACT. The gate insulating layer 12 may be disposed between the silicide gate electrode G and the substrate 10.

The silicide gate electrode G may include a silicide material. The silicide gate electrode G may be formed through a reaction between polysilicon and metal. The silicide gate electrode G may have a different structure depending on a degree in which a polysilicon layer has been silicided. For example, if the silicide gate electrode G has been formed by siliciding a part of the polysilicon layer, the silicide gate electrode G may partially include the silicide material. The silicide gate electrode G may have a partially silicided structure, and may include an unreacted polysilicon layer. As another example, if the silicide gate electrode G is formed by fully siliciding the polysilicon layer, the silicide gate electrode G may be made of the silicide material and may be a metal silicide layer. The silicide gate electrode G may have a fully silicided structure, and in that example would not include an unreacted polysilicon layer. For reference, if the silicide gate electrode G includes an unreacted polysilicon layer in a very small amount due to a limit in a process, the silicide gate electrode G may be considered to be made of the silicide material. The silicide gate electrode G may include metal silicide, such as for example nickel silicide (NiSix).

The spacer SP may surround the sidewall of the silicide gate electrode G. The spacer SP may be an insulating spacer including an insulating material, such as for example a silicon oxide or nitride. The spacer SP may have a height different from the height of the silicide gate electrode G. As an embodiment, the silicide gate electrode G may have a first height H1, and the spacer SP may have a second height H2 greater than the first height H1.

The spacer SP may be disposed in the first interlayer insulating layer IL1. An upper surface of the spacer SP and an upper surface of the first interlayer insulating layer IL1 may be disposed substantially at the same level. The upper surface of the spacer SP and an upper surface of the silicide source contact S may be disposed substantially at the same level. The upper surface of the spacer SP and an upper surface of the silicide drain contact D may be disposed substantially at the same level. Here, for example, the term "substantially same" means not only that numerical values correspond to each other but also that the numerical values are within a range including errors in processes.

The first epitaxial pattern EP1 may protrude from the substrate 10. The first epitaxial pattern EP1 may have a third height H3. The third height H3 may be greater than the first height H1 of the silicide gate electrode G, and may be smaller than the second height H2 of the spacer SP. The first interlayer insulating layer IL1 may be disposed on the substrate 10. The first epitaxial pattern EP1 may be connected to the substrate 10 through an opening in the first interlayer insulating layer IL1. The first epitaxial pattern EP1 may be a pattern that has epitaxially grown from the substrate 30 by using an epitaxial method. In one embodiment, the first epitaxial pattern EP1 may be single crystal silicon. An interface may or may not be present between the first epitaxial pattern EP1 and the substrate 10.

The second epitaxial pattern EP2 may protrude from the substrate 10. The second epitaxial pattern EP2 may have a fourth height H4. The fourth height H4 may be greater than the first height H1 of the silicide gate electrode G, and may be smaller than the second height H2 of the spacer SP. The second epitaxial pattern EP2 may be connected to the substrate 10 through the first interlayer insulating layer IL1. The second epitaxial pattern EP2 may be a pattern that has grown from the substrate 10 by using an epitaxial method. In another embodiment, the second epitaxial pattern EP2 may be single crystal silicon. An interface may or may not be present between the second epitaxial pattern EP2 and the substrate 10. The fourth height H4 may be substantially the same or different from the third height H3.

The silicide gate electrode G may be disposed between the first epitaxial pattern EP1 and the second epitaxial pattern EP2. An upper surface of the silicide gate electrode G may be disposed at a level different from the levels of the upper surface of the first epitaxial pattern EP1 and the upper surface of the second epitaxial pattern EP2. The upper surface of the first epitaxial pattern EP1 may be disposed at a higher level than the upper surface of the silicide gate electrode G. The upper surface of the second epitaxial pattern EP2 may be disposed at a higher level than the upper surface of the silicide gate electrode G.

The silicide source contact S may be connected to the first epitaxial pattern EP1. The silicide source contact S may be disposed in the first interlayer insulating layer IL1, and may be disposed on the first epitaxial pattern EP1. The upper surface of the silicide source contact S may be disposed substantially at the same level as the upper surface of the first interlayer insulating layer IL1.

The silicide drain contact D may be connected to the second epitaxial pattern EP2. The silicide drain contact D may be disposed in the first interlayer insulating layer IL1, and may be disposed on the second epitaxial pattern EP2. The upper surface of the silicide drain contact D may be disposed substantially at the same level as the upper surface of the first interlayer insulating layer IL1.

The second interlayer insulating layer IL2 may be disposed on the first interlayer insulating layer IL1. The second interlayer insulating layer IL2 may be disposed on the silicide source contact S and the silicide drain contact D. The second interlayer insulating layer IL2 may extend into the spacer SP. The second interlayer insulating layer IL2 may contact the silicide gate electrode G and an inner sidewall of the spacer SP. The spacer SP may be disposed between the first interlayer insulating layer IL1 and the second interlayer insulating layer IL2.

Interconnection structures may be disposed within the second interlayer insulating layer IL2. The interconnection structures may be for applying a bias to the silicide gate electrode G, the silicide source contact S, and the silicide drain contact D. In one embodiment, the first interconnection structure IC1, the second interconnection structure IC2, and the third interconnection structure IC3 may be disposed within the second interlayer insulating layer IL2. Each of the first interconnection structure IC1, the second interconnection structure IC2, and the third interconnection structure IC3 may include a via or a wiring.

The first interconnection structure IC1 may include a first via V1 and a first line L1 that is connected to the first via V1. The first via V1 may be connected to the silicide gate electrode G. The first via V1 may extend into the spacer SP through the second interlayer insulating layer IL2, and may be electrically connected to the silicide gate electrode G. The first interconnection structure IC1 may include a first barrier layer B1 and a first metal layer M1 in the first barrier layer B1. The first barrier layer B1 may include metal nitride, such as for example titanium nitride. The first metal layer M1 may include metal, such as for example tungsten (W) or molybdenum (Mo).

The second interconnection structure IC2 may include a second via V2 and a second line L2 that is connected to the second via V2. The second via V2 may be connected to the silicide source contact S. The second via V2 may extend through the second interlayer insulating layer IL2, and may be electrically connected to the silicide source contact S.

Contact resistance between the first epitaxial pattern EP1 and the second interconnection structure IC2 can be reduced by the silicide source contact S. The second interconnection structure IC2 may include a second barrier layer B2 and a second metal layer M2 in the second barrier layer B2. The second barrier layer B2 may include metal nitride, such as for example titanium nitride. The second metal layer M2 may include metal, such as for example tungsten (W) or molybdenum (Mo).

The third interconnection structure IC3 may include a third via V3 and a third line L3 that is connected to the third via V3. The third via V3 may be connected to the silicide drain contact D. The third via V3 may extend through the second interlayer insulating layer IL2, and may be electrically connected to the silicide drain contact D. Contact resistance between the second epitaxial pattern EP2 and the third interconnection structure IC3 can be reduced by the silicide drain contact D. The third interconnection structure IC3 may include a third barrier layer B3 and a third metal layer M3 in the third barrier layer B3. The third barrier layer B3 may include metal nitride, such as for example titanium nitride. The third metal layer M3 may include metal, such as for example tungsten (W) or molybdenum (Mo).

According to the aforementioned inventive structure, the gate insulating layer 12, the silicide gate electrode G, the first epitaxial pattern EP1, the second epitaxial pattern EP2, the silicide source contact S, and the silicide drain contact D may constitute a transistor. In this case, the silicide gate electrode G may include a silicide material. With this structure, ROD can be improved, and the operating speed of the transistor formed with this inventive structure can be increased by the silicide gate electrode G.

The silicide gate electrode G may have a lower specific resistance than a gate electrode that is formed by combining polysilicon and metal/silicide. The silicide gate electrode G can have a lower height for the gate electrode G as compared to the height of a gate electrode that is formed by combining polysilicon and metal/silicide. The silicide gate electrode G can reduce the parasitic capacitance between the gate electrode G and the silicide source contact/drain contact S/D. Since the silicide source contact S and the silicide drain contact D are disposed on the first epitaxial pattern EP1 and the second epitaxial pattern EP2, respectively, an interval between a channel of the transistor and the silicide source contact/drain contact S/D can be increased, and junction leakage can be improved.

The transistor formed with this inventive structure may be a transistor that is included in a semiconductor device. In one embodiment, the transistor formed with this inventive structure may be included in a circuit, such as a page buffer, a row decoder, or a resistor. The resistor may be formed to include the silicide gate electrode and a desired resistance value can be implemented without changing a pitch of the resistor. In this case, a layout of the semiconductor device can be simplified.

Figure 2:
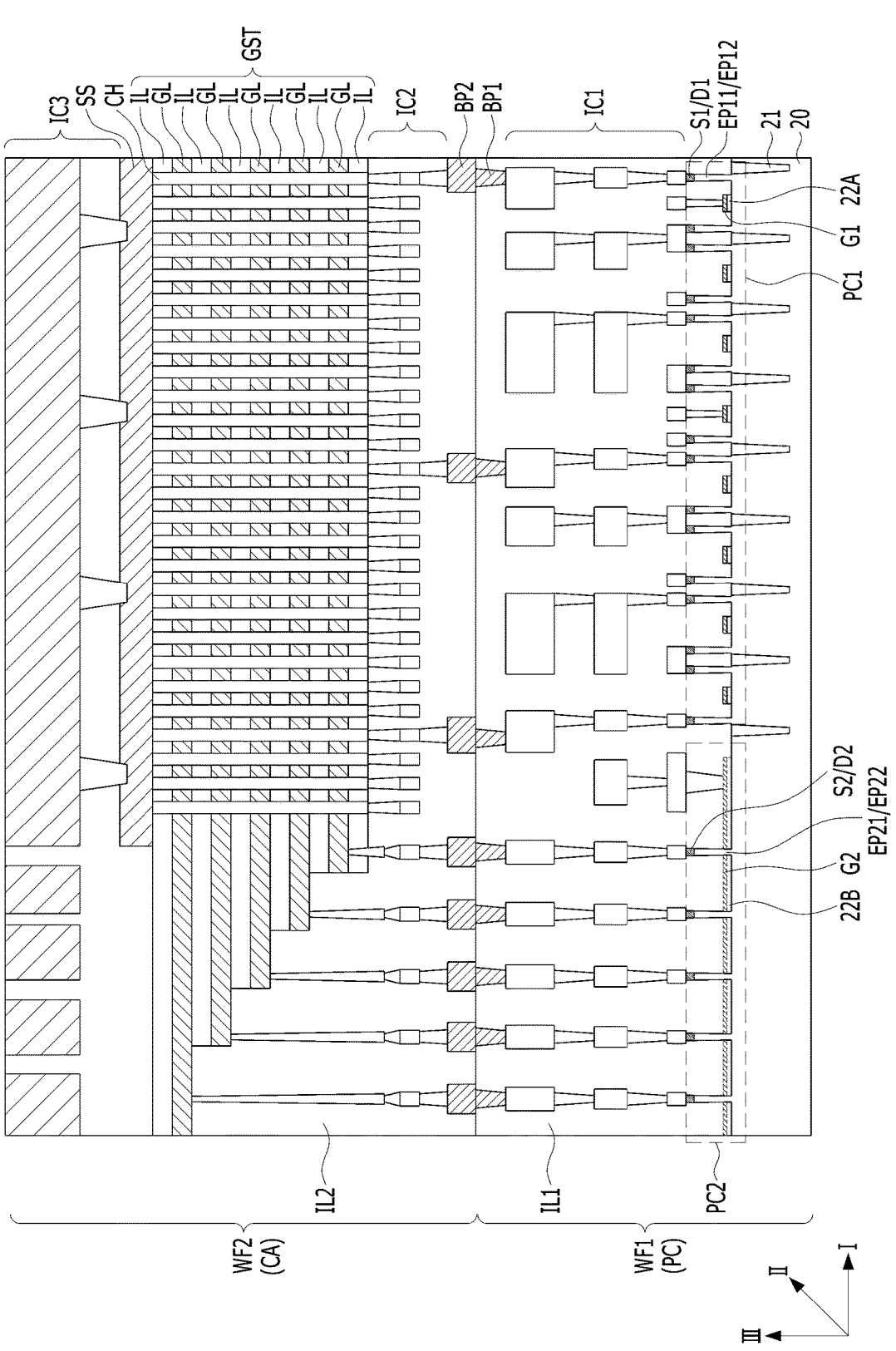
FIG. 2 is a cross-sectional view illustrating a structure of a semiconductor device according to another embodiment of the present disclosure.

FIG. 2 is a cross-sectional view illustrating a structure of a semiconductor device according to one embodiment of the present disclosure. Hereinafter, contents that are redundant with the aforementioned contents may be omitted.

Referring to FIG. 2, the semiconductor device may include a first wafer WF1 and a second wafer WF2, and may have a structure in which the first wafer WF1 and the second wafer WF2 have been bonded together. The first wafer WF1 may include a peripheral circuit PC. The second wafer WF2 may include a cell array CA. The cell array CA may include stacked memory cells. The peripheral circuit PC may include a circuit for driving the cell array. At least one of the first wafer WF1 and the second wafer WF2 might not include a substrate. For example, the first wafer WF1 and the second wafer WF2 may be bonded to each other and a substrate of the second wafer WF2 may be removed.

The first wafer WF1 may include a substrate 20 and an isolation layer 21 (similar to the isolation layer 11 shown in FIG. 1). The peripheral circuit PC may be disposed on the substrate 20, and may include a first circuit PC1 and a second circuit PC2. The first circuit PC1 may include a page buffer. The second circuit PC2 may include a row decoder. In one embodiment, the second circuit PC2 may include a pass transistor. The pass transistor may be a switch for controlling the connection of a global line and a local line.

A first transistor of the first circuit PC1 may include a first gate insulating layer 22A, a first gate electrode G1, a first epitaxial pattern EP11, a second epitaxial pattern EP12, a first silicide source contact S1, and a first silicide drain contact D1 (similar to the gate insulating layer 12, the silicide gate electrode G, the first epitaxial pattern EP1, the second epitaxial pattern EP2, the silicide source contact S, and the silicide drain contact D in FIG. 1). In this case, the first gate electrode G1 may include a silicide material, and may be a metal silicide layer. The first silicide source contact S1 may be disposed on the first epitaxial pattern EP11. The first silicide drain contact D1 may be disposed on the second epitaxial pattern EP12.

A second transistor of the second circuit PC2 may include a second gate insulating layer 22B, a second gate electrode G2, a first epitaxial pattern EP21, a second epitaxial pattern EP22, a second silicide source contact S2, and a second silicide drain contact D2. The second gate electrode G2 may extend in a first direction I. The second gate electrode G2 might not be located at the same cross section as the second silicide source contact S2 and the second silicide drain contact D2. The second gate electrode G2 may adjacent to the second silicide source contact S2 and the second silicide drain contact D2 in a second direction II intersecting the first direction I. The second silicide source contact S2 and the second silicide drain contact D2 may extend from the substrate 20 in a third direction III. The third direction may be orthogonal to a plane defined by the first direction I and the second direction II. The second gate electrode G2 may include a silicide material, and may be a metal silicide layer. The second silicide source contact S2 may be disposed on the first epitaxial pattern EP21. The second silicide drain contact D2 may be disposed on the second epitaxial pattern EP22.

The first wafer WF1 may further include a first interlayer insulating layer IL1, a first interconnection structure IC1, or a first bonding pad BP1 or may further include the first interlayer insulating layer IL1, the first interconnection structure IC1, or the first bonding pad BP1 in combination. The first interconnection structure IC1 may be disposed within the first interlayer insulating layer IL1, and may be electrically connected to the first circuit PC1 and/or the second circuit PC2. The first bonding pad BP1 may be disposed in the first interlayer insulating layer IL1, and may be electrically connected to the first interconnection structure IC1.

The second wafer WF2 may include a source structure SS, a gate structure GST, a channel structure CH, a second interlayer insulating layer IL2, a second interconnection structure IC2, a third interconnection structure IC3, or a second bonding pad BP2 or may include the source structure SS, the gate structure GST, the channel structure CH, the second interlayer insulating layer IL2, the second interconnection structure IC2, the third interconnection structure IC3, or the second bonding pad BP2 in combination. The gate structure GST may include gate lines GL and insulating layers IL that are alternately stacked. The gate lines GL may each be a word line or a selection line. The channel structure CH may be disposed in the gate structure GST, and may extend through the gate structure GST. Memory cells may be disposed in areas in which the channel structure CH and the gate lines GL are intersected.

The second interconnection structure IC2 may be disposed within the second interlayer insulating layer IL2. The second interconnection structure IC2 may include a bit line. The channel structure CH may be connected between the source structure SS and the bit line. The second interconnection structure IC2 may include vias that are connected to the gate lines GL, respectively. The third interconnection structure IC3 may be electrically connected to the source structure SS, etc. The second bonding pad BP2 may be disposed within the second interlayer insulating layer IL2, and may be electrically connected to the second interconnection structure IC2. The first wafer WF1 and the second wafer WF2 may be electrically connected through the first bonding pad BP1 and the second bonding pad BP2.

According to the aforementioned structure, in one embodiment, the semiconductor device may have a wafer bonding structure. Since the first wafer WF1 and the second wafer WF2 can be separately manufactured, the peripheral circuit PC can be prevented from being influenced by a thermal treatment process that is used in a process of forming the cell array CA or the influence of the thermal treatment process on the peripheral circuit PC can be reduced. Furthermore, since the peripheral circuit PC includes in one embodiment a transistor having a fully silicided structure, a characteristic of the transistor, such as ROD, can be improved.

FIGS. 3A to 3J are diagrams for describing a method of manufacturing a semiconductor device according to various embodiments of the present disclosure. Hereinafter, contents redundant with the aforementioned contents may be omitted.

Figure 3A:
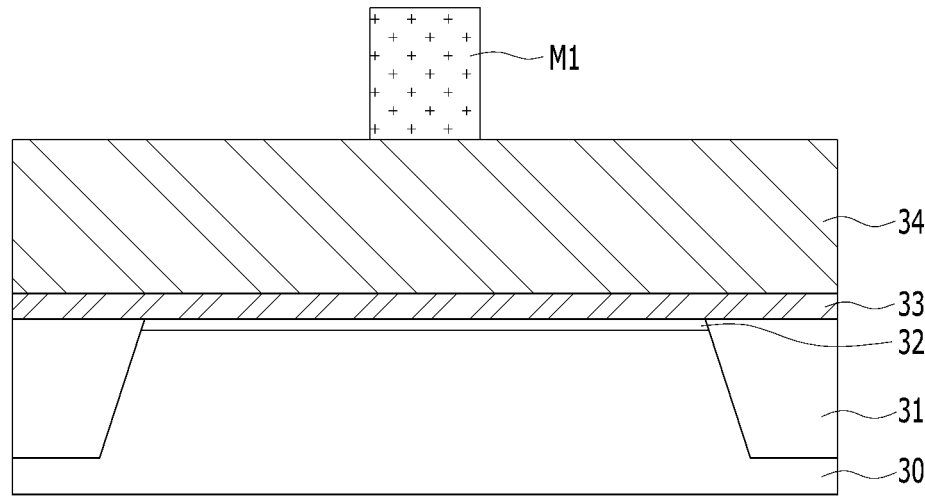
FIGS. 3A to 3J are diagrams for describing a method of manufacturing a semiconductor device according to various embodiments of the present disclosure.
Figure 3B:
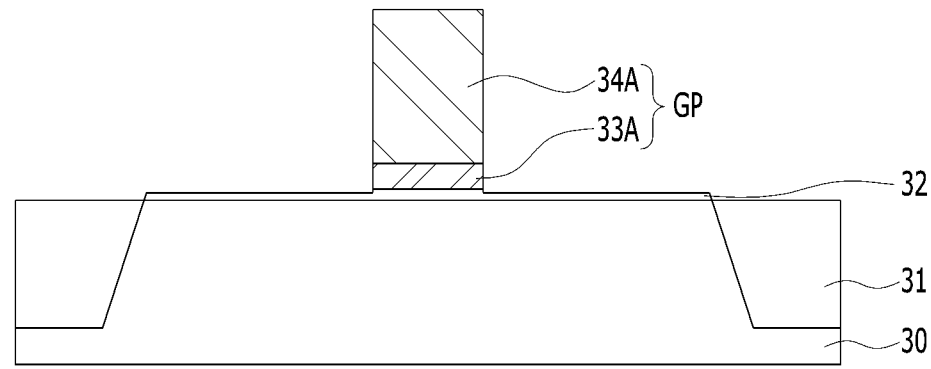

Referring to FIGS. 3A and 3B, a gate pattern GP may be formed over a substrate 30. The gate pattern GP may include a sacrificial pattern 33A to be substituted with (or chemically converted into) a silicide gate electrode in a subsequent process.

First, referring to FIG. 3A, an isolation layer 31 may be formed within the substrate 30. A gate insulating layer 32 may be formed on the substrate 30. The gate insulating layer 32 may be formed by using an oxidation process. Next, a sacrificial layer 33 may be formed over the substrate 30. The sacrificial layer 33 may include undoped polysilicon. The sacrificial layer 33 may have a thickness of 200 to 500 Å. In one embodiment, the sacrificial layer 33 may have a thickness of about 300 Å.

Next, a hard mask 34 may be formed on the sacrificial layer 33. The hard mask 34 may be formed by using a deposition process. The hard mask 34 may include a silicon nitride. Next, a first mask pattern M1 may be formed on the hard mask 34. The first mask pattern M1 may include a photoresist.

Next, referring to FIG. 3B, a hard mask pattern 34A may be formed by etching the hard mask 34 by using the first mask pattern M1 as an etch barrier. Next, the sacrificial pattern 33A may be formed by etching the sacrificial layer 33 by using the hard mask pattern 34A as an etch barrier. Accordingly, the gate pattern GP including the sacrificial pattern 33A and the hard mask pattern 34A may be formed. In the process of etching the sacrificial layer 33, the gate insulating layer 32 may be partially etched. Next, the first mask pattern M1 may be removed, and a cleaning process may be performed.

The sacrificial pattern 33A may be substituted with a silicide gate electrode in a subsequent process. If a gate electrode is formed by directly etching a polysilicon layer, a metal layer and/or a silicide layer, a profile of the gate pattern GP may be modified in the etch process. According to one embodiment of the present disclosure, since the sacrificial pattern 33A is formed by etching the sacrificial layer 33, the profile of the gate pattern GP can be prevented from being deformed in the etch process or the deformation of the profile of the gate pattern GP can be reduced. Furthermore, the thickness of the gate insulating layer 32, which remains after the etch process, may be uniform.

Figure 3C:
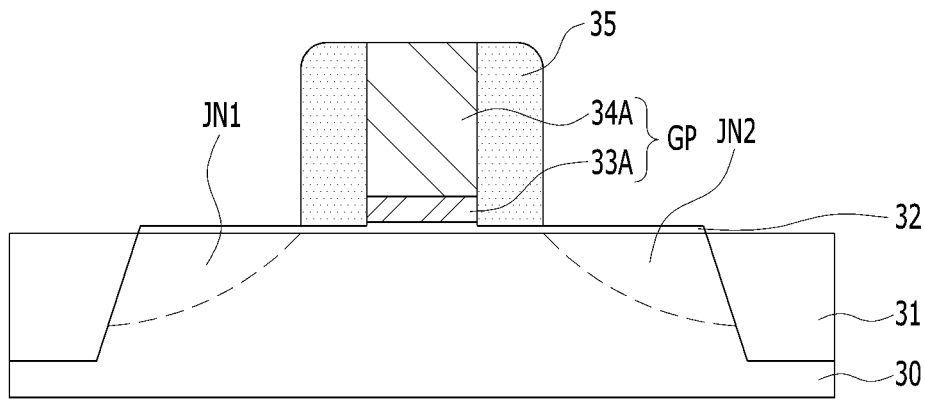

Referring to FIG. 3C, a spacer 35 may be formed on the sidewall of the gate pattern GP. In one embodiment, after a spacer layer is deposited along the profile of the gate pattern GP, the spacer 35 may be formed by performing an etch-back process. After the etch-back process is performed, a cleaning process may be performed. The spacer 35 may include an insulating material, such as for example a silicon oxide or nitride. In one embodiment, the spacer 35 may include a low dielectric constant material, and may include oxide, such as for example a silicon oxide. Since the spacer 35 is formed by using the low dielectric constant material, parasitic capacitance between a gate electrode and a source contact/drain contact can be reduced, and ROD can be improved.

Next, junctions JN1 and JN2 may be formed within the substrate 30. The junctions JN1 and JN2 may each have a lightly doped drain (LDD) structure. In one embodiment, a first junction JN1 and a second junction JN2 may be formed on both sides of the gate pattern GP by doping impurities into the substrate 30. The first junction JN1 may be a source area, and the second junction JN2 may be a drain area.

Figure 3D:
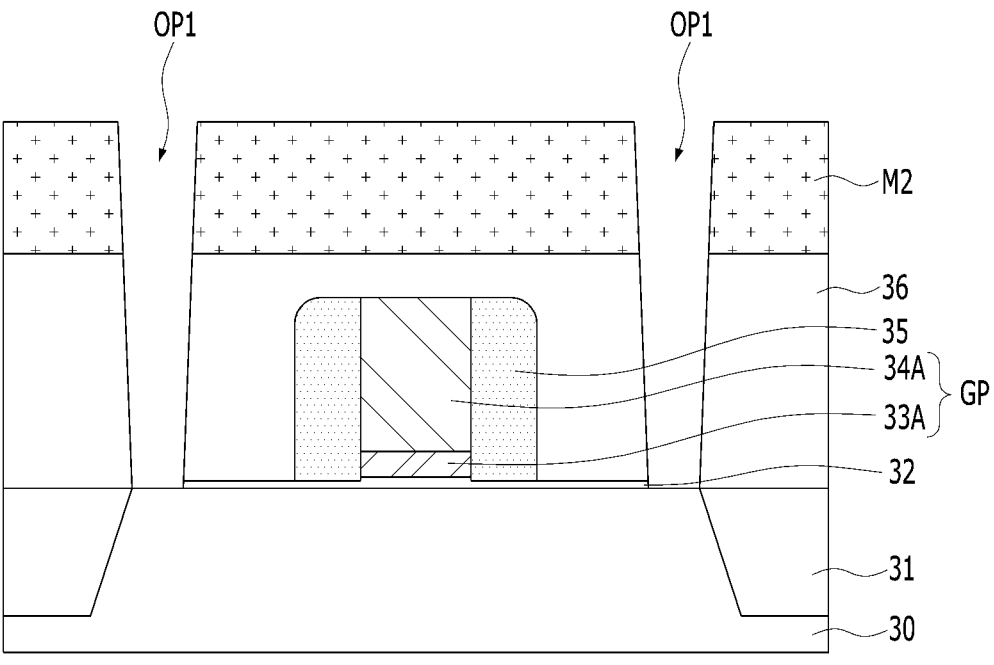

Referring to FIG. 3D, a first interlayer insulating layer 36 may be formed. The first interlayer insulating layer 36 may include an insulating material, such as silicon oxide or nitride. In one embodiment, after an oxide layer is deposited, the first interlayer insulating layer 36 may be formed by performing a planarization process. The planarization process may be performed by using a chemical mechanical polishing (CMP) method.

Next, a second mask pattern M2 may be formed on the first interlayer insulating layer 36. The second mask pattern M2 may include a photoresist. Next, first openings OP1 may be formed by etching the first interlayer insulating layer 36 by using the second mask pattern M2 as an etch barrier. The first openings OP1 may be for forming a source contact and a drain contact. The first openings OP1 may expose the substrate 30. Next, the second mask pattern M2 may be removed, and a cleaning process may be performed.

Figure 3E:
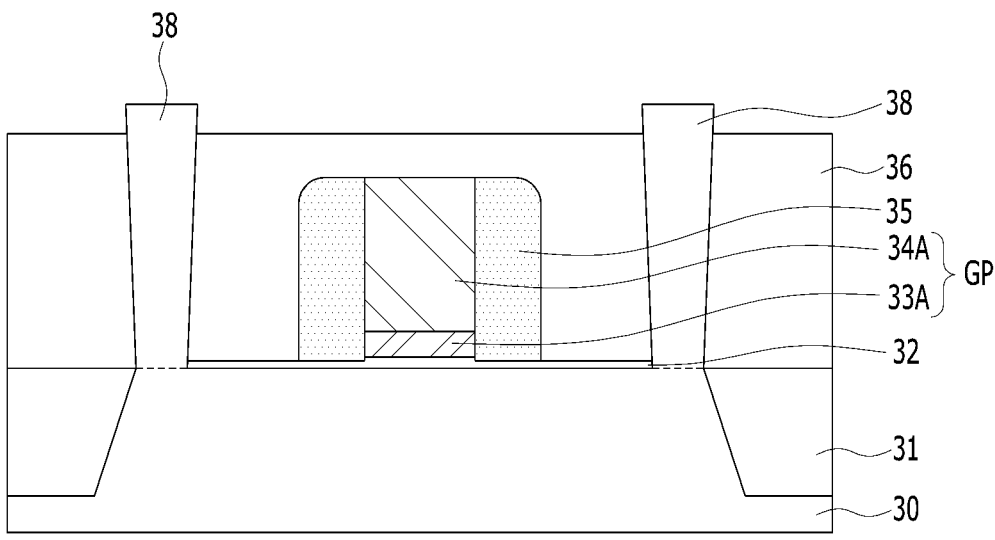
Figure 3F:
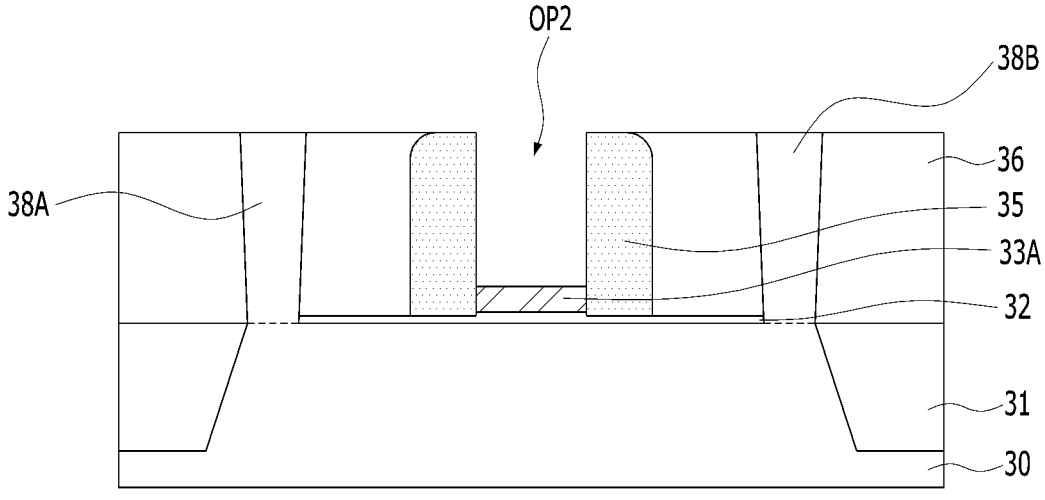

Referring to FIGS. 3E and 3F, a first epitaxial pattern 38A and a second epitaxial pattern 38B may be formed. The first epitaxial pattern 38A and the second epitaxial pattern 38B may each be a via that connects a channel of a transistor and a source contact/drain contact. Locations of the source contact and the drain contact may be adjusted by the first epitaxial pattern 38A and the second epitaxial pattern 38B.

First, referring to FIG. 3E, an epitaxial layer 38 may be formed in the first opening OP1. In one embodiment, the epitaxial layer 38 may be grown from a surface of the substrate 30 by using an epitaxial growth method. The epitaxial layer 38 may be a single crystal silicon layer. The epitaxial layer 38 may be grown to a greater height than the sacrificial pattern 33A.

Next, the first epitaxial pattern 38A and the second epitaxial pattern 38B that are disposed in the first openings OP1, respectively, may be formed. In one embodiment, the epitaxial layer 38 may be planarized by using the hard mask pattern 34A as a stop layer. Accordingly, the first epitaxial pattern 38A and the second epitaxial pattern 38B that extend through the first interlayer insulating layer 36 and that are connected to the substrate 30 may be formed. The first epitaxial pattern 38A may be connected to the source area, and the second epitaxial pattern 38B may be connected to the drain area. The first epitaxial pattern 38A and the second epitaxial pattern 38B may have a greater height than the sacrificial pattern 33A.

Next, a second opening OP2 may be formed by removing the hard mask pattern 34A. In one embodiment, the sacrificial pattern 33A may be selectively removed for example by a dip-out method. The sacrificial pattern 33A may be exposed through the second opening OP2. The sacrificial pattern 33A, the first epitaxial pattern 38A, and the second epitaxial pattern 38B may be exposed at different levels. Upper surfaces of the first epitaxial pattern 38A and the second epitaxial pattern 38B may be exposed through an upper surface of the first interlayer insulating layer 36. An upper surface of the sacrificial pattern 33A may be exposed at a lower level than the upper surfaces of the first epitaxial pattern 38A and the second epitaxial pattern 38B.

Figure 3G:
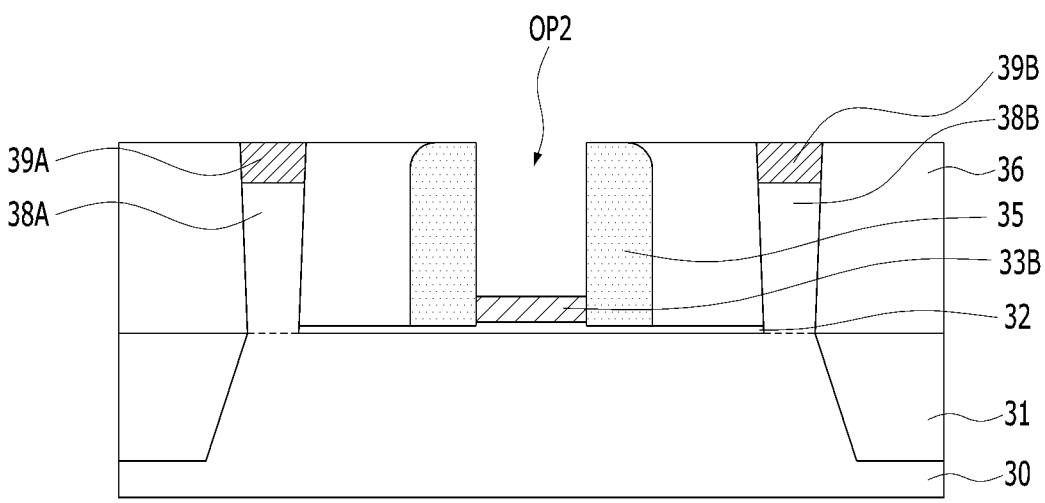

Referring to FIG. 3G, a silicide gate electrode 33B may be formed. In one embodiment, after a metal layer is formed on the sacrificial pattern 33A and a thermal treatment process is performed, an unreacted metal layer may be removed. Next, a cleaning process may be performed.

The metal layer may be formed in the second opening OP2, and may be formed on the sacrificial pattern 33A. The metal layer may be formed along a profile of the sacrificial pattern 33A that is exposed through the second opening OP2 and the spacer 35. The metal layer may include metal, such as for example nickel (Ni), platinum (Pt), tungsten (W), or molybdenum (Mo). A silicide layer may be formed through a reaction between the metal layer and the sacrificial pattern 33A by a thermal treatment process. For example, nickel silicide (NiSix) may be formed through a reaction between nickel and polysilicon. The sacrificial pattern 33A may be fully silicided. Accordingly, in one embodiment, the sacrificial pattern 33A is considered to have been substituted with the silicide gate electrode 33B formed by the reaction of the silicon in the sacrificial pattern 33A with the metal deposited on the sacrificial pattern 33A. In this "substituted with" embodiment, a fraction or all of the silicon in the sacrificial pattern 33A is converted to a silicide. The silicide gate electrode 33B may include a silicide material, and may be a metal silicide layer.

A silicide source contact 39A may be formed on the first epitaxial pattern 38A. A part of the first epitaxial pattern 38A may be substituted with the silicide source contact 39A. In one embodiment, after a metal layer is formed on the first epitaxial pattern 38A and a thermal treatment process is performed, an unreacted metal layer may be removed. The metal layer may be formed on the first interlayer insulating layer 36 and may come into contact with the upper surface of the first epitaxial pattern 38A. A silicide layer may be formed through a reaction between the metal layer and the first epitaxial pattern 38A by the thermal treatment process.

Slicidation may be performed from the upper surface of the first epitaxial pattern 38A, and the silicide source contact 39A may be formed on the first epitaxial pattern 38A. Accordingly, the silicide source contact 39A may be formed at a level different from the level of the silicide gate electrode 33B. Accordingly, parasitic capacitance between the silicide gate electrode 33B and the silicide source contact 39A can be reduced.

A silicide drain contact 39B may be formed on the second epitaxial pattern 38B. A part of the second epitaxial pattern 38B may be substituted with the silicide drain contact 39B. In one embodiment, after a metal layer is formed on the second epitaxial pattern 38B and a thermal treatment process is performed, the unreacted metal layer may be removed. The metal layer may be formed on the first interlayer insulating layer 36, and may come into contact with the upper surface of the second epitaxial pattern 38B. A silicide layer may be formed through a contact between the metal layer and the second epitaxial pattern 38B by the thermal treatment process.

Silicidation may be performed from the upper surface of the second epitaxial pattern 38B. The silicide drain contact 39B may be formed on the second epitaxial pattern 38B. Accordingly, the silicide drain contact 39B may be formed at a level different from the level of the silicide gate electrode 33B. Accordingly, parasitic capacitance between the silicide gate electrode 33B and the silicide drain contact 39B can be reduced.

The silicide gate electrode 33B, the silicide source contact 39A, and the silicide drain contact 39B may be simultaneously formed or may each be formed by a separate process. In one embodiment, after a metal layer is formed on the silicide gate electrode 33B, the silicide source contact 39A, and the silicide drain contact 39B, a thermal treatment process may be performed. Accordingly, when the silicide gate electrode 33B is formed, the silicide source contact 39A and the silicide drain contact 39B may be formed.

Figure 3H:
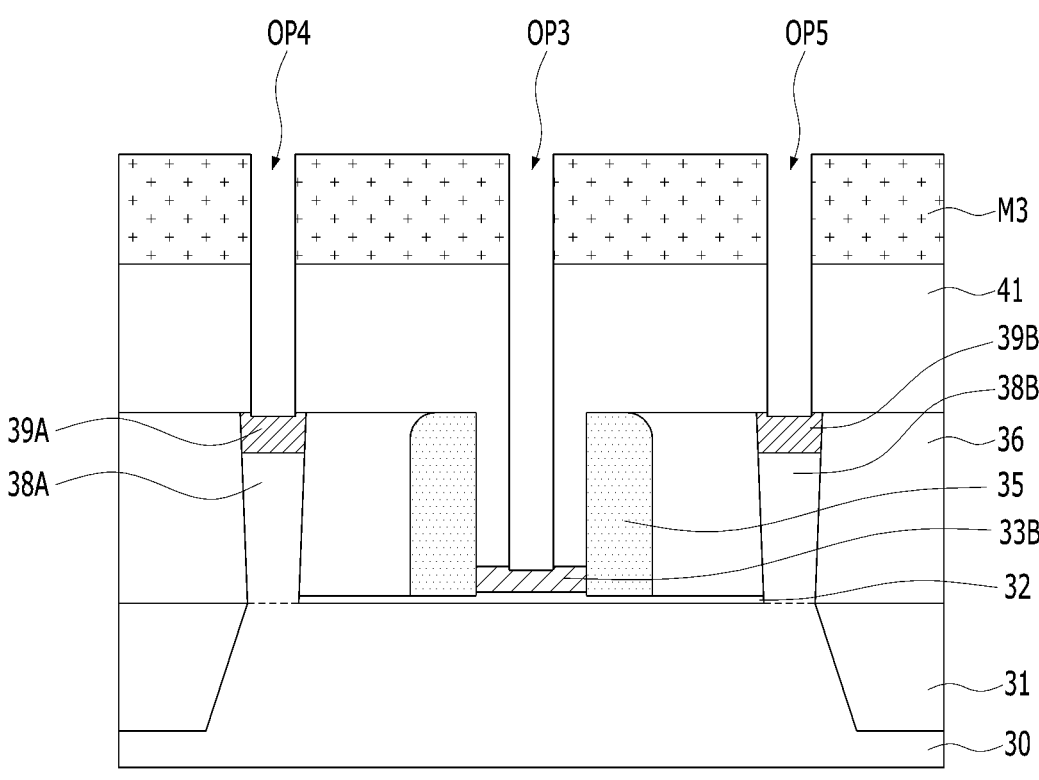

Referring to FIG. 3H, a second interlayer insulating layer 41 may be formed. In one embodiment, after an insulating layer is deposited so that the second opening OP2 is filled, the second interlayer insulating layer 41 may be formed by planarizing the insulating layer. The second interlayer insulating layer 41 may include an insulating material, such as for example a silicon oxide or nitride. The second interlayer insulating layer 41 may be disposed on the silicide source contact 39A and the silicide drain contact 39B, and may extend into and contact sidewalls of the spacer 35.

Next, a third mask pattern M3 may be formed on the second interlayer insulating layer 41. The third mask pattern M3 may include a photoresist. Next, the second interlayer insulating layer 41 may be etched by using the third mask pattern M3 as an etch barrier. Accordingly, a third opening OP3 that exposes the silicide gate electrode 33B may be formed. A fourth opening OP4 that exposes the silicide source contact 39A may be formed. A fifth opening OP5 that exposes the silicide drain contact 39B may be formed.

The third opening OP3, the fourth opening OP4, and the fifth opening OP5 may each be a via trench. The third opening OP3, the fourth opening OP4, and the fifth opening OP5 may extend through the second interlayer insulating layer 41. The third opening OP3, the fourth opening OP4, and the fifth opening OP5 may be simultaneously formed or may each be formed by a separate process by using a separate mask pattern. Next, the third mask pattern M3 may be removed, and a cleaning process may be performed.

Figure 3I:
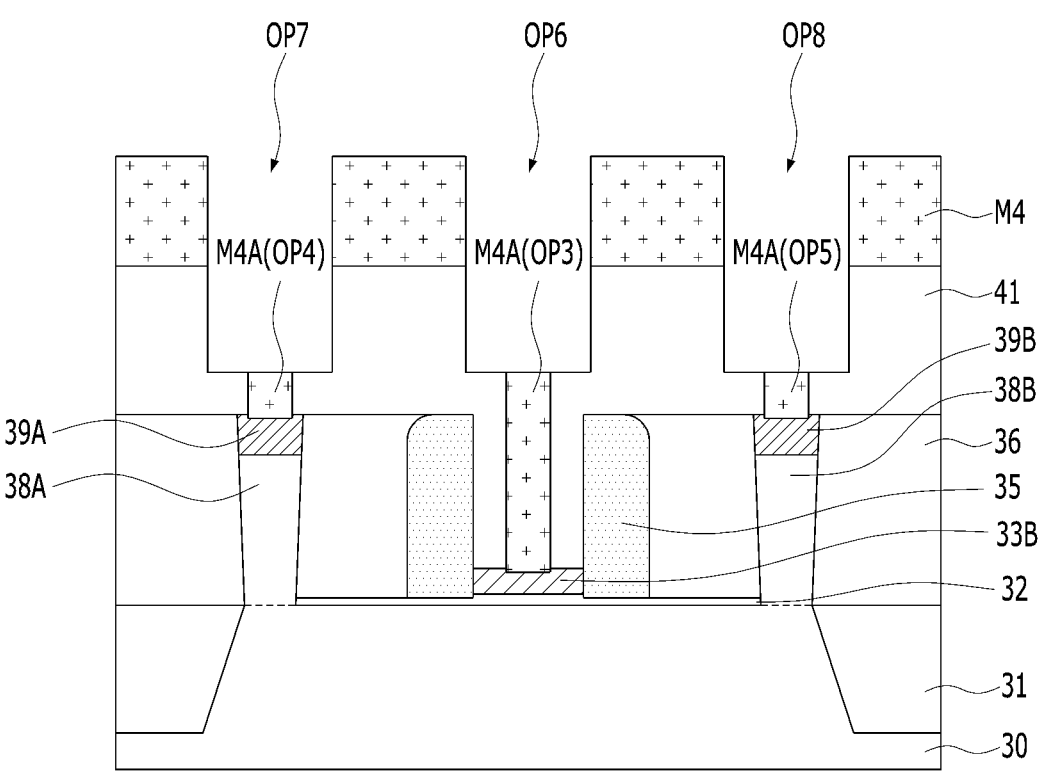

Referring to FIG. 3I, a fourth mask pattern M4 may be formed on the second interlayer insulating layer 41. The fourth mask pattern M4 may include a photoresist. Next, the second interlayer insulating layer 41 may be etched by using the fourth mask pattern M4 as an etch barrier. A sixth opening OP6 that is connected to the third opening OP3 may be formed. A seventh opening OP7 that is connected to the fourth opening OP4 may be formed. An eighth opening OP8 that is connected to the fifth opening OP5 may be formed.

The sixth opening OP6, the seventh opening OP7, and the eighth opening OP8 may each be a wiring trench. The sixth opening OP6, the seventh opening OP7, and the eighth opening OP8 may be simultaneously formed or may each be formed by a separate process by using a separate mask pattern.

Next, the fourth mask pattern M4 may be removed, and a cleaning process may be performed. When the fourth mask pattern M4 is formed, a mask material M4A may be formed in the third opening OP3, the fourth opening OP4, and the fifth opening OP5. The mask material M4A may be removed simultaneously when the fourth mask pattern M4 is removed.

Figure 3J:
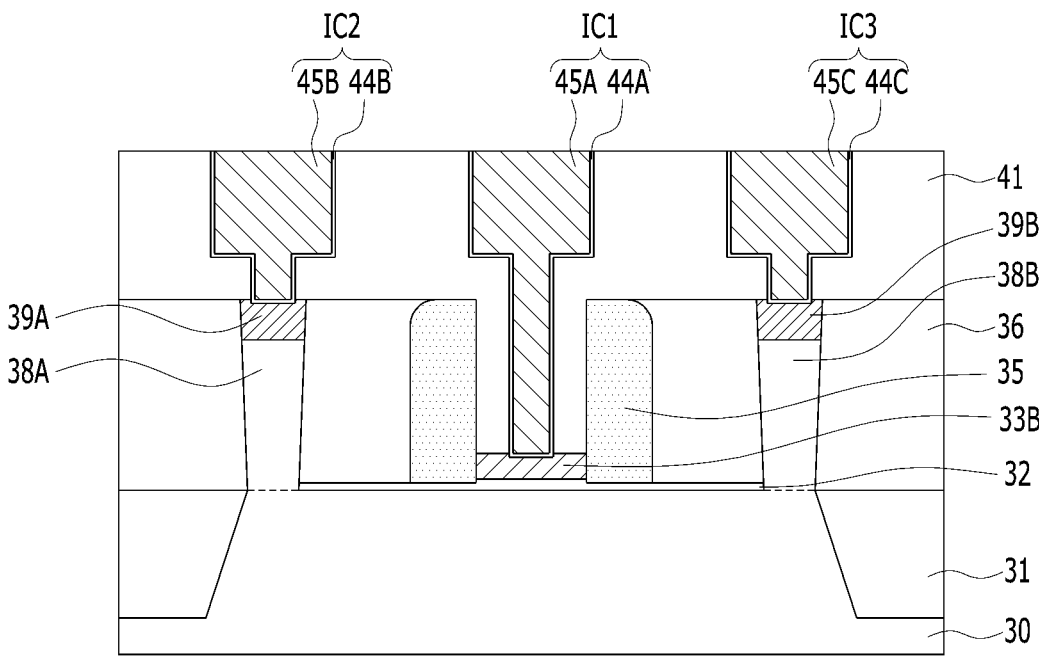

Referring to FIG. 3J, a first interconnection structure IC1 may be formed in the third opening OP3 and the sixth opening OP6. In one embodiment, a first barrier layer 44A may be formed, and a first metal layer 45A may be formed in the first barrier layer 44A. The first barrier layer 44A may include a metal nitride. The first metal layer 45A may include metal, such as for example tungsten (W) or molybdenum (Mo).

A second interconnection structure IC2 may be formed in the fourth opening OP4 and the seventh opening OP7. In one embodiment, a second barrier layer 44B may be formed, and a second metal layer 45B may be formed in the second barrier layer 44B. The second barrier layer 44B may include a metal nitride. The second metal layer 45B may include metal, such as for example tungsten (W) or molybdenum (Mo).

A third interconnection structure IC3 may be formed in the fifth opening OP5 and the eighth opening OP8. As an embodiment, a third barrier layer 44C may be formed, and a third metal layer 45C may be formed in the third barrier layer 44C. The third barrier layer 44C may include a metal nitride. The third metal layer 45C may include metal, such as for example tungsten (W) or molybdenum (Mo).

The first barrier layer 44A, the second barrier layer 44B, and the third barrier layer 44C may be simultaneously formed or may each be formed by a separate process. The first metal layer 45A, the second metal layer 45B, and the third metal layer 45C may be simultaneously formed or may each be formed by a separate process. Next, the first metal layer 45A may be planarized, and a cleaning process may be performed.

According to the aforementioned manufacturing method, the silicide gate electrode 33B may be formed by substituting the sacrificial pattern 33A with the silicide layer. In a comparative process, if a gate electrode is formed to have a multi-layer structure including a polysilicon layer and a metal layer/silicide layer, an impurity injection process may be performed in order to reduce dopant depletion within the polysilicon layer. However, according to the present disclosure, such a comparative process can be simplified, and the manufacturing cost can be reduced with the inventive substitutional method because the impurity injection can be omitted in forming the silicide gate electrode 33B.

The first epitaxial pattern 38A and the second epitaxial pattern 38B may be formed by using an epitaxial growth process. Junction leakage can be improved by increasing a distance between the substrate 30 and the silicide source contact/drain contact 39A/39B through the first/second epitaxial pattern 38A/38B. Parasitic capacitance between the silicide gate electrode 33B and the silicide source contact/drain contact 39A/39B can be reduced because the silicide source contact 39A and the silicide drain contact 39B are formed at a level different from the level of the silicide gate electrode 33B.

Although embodiments according to the technical scope of the present disclosure have been described above with reference to the accompanying drawings, the embodiments have been provided to merely describe various embodiments of the present disclosure, and the present disclosure is not limited to the disclosed embodiments. A person having ordinary knowledge in the art to which the present disclosure pertains may substitute, modify, and change the disclosed embodiments in various ways without departing from the technical scope of the present disclosure. Such substitutions, modifications, and changes belong to the scope of the present disclosure.

What is claimed is:

1. A semiconductor device comprising:
   a silicide gate electrode that is disposed over a substrate;
   a first epitaxial pattern that protrudes from the substrate;
   a second epitaxial pattern that protrudes from the substrate;
   a silicide source contact that is connected to the substrate through the first epitaxial pattern and that is disposed at a first level different from a top level of the silicide gate electrode;
   a silicide drain contact that is connected to the substrate through the second epitaxial pattern and that is disposed at a second level different from the top level of the silicide gate electrode; and
   an insulating spacer that surrounds a sidewall of the silicide gate electrode,
   wherein at least one of the first epitaxial pattern and the second epitaxial pattern has a greater height than the silicide gate electrode,
   wherein the insulating spacer has a greater height than the silicide gate electrode, and
   wherein the insulating spacer has a greater height than at least one of the first epitaxial pattern and the second epitaxial pattern.

2. The semiconductor device of claim 1, wherein the silicide source contact is disposed on the first epitaxial pattern.

3. The semiconductor device of claim 1, wherein the silicide drain contact is disposed on the second epitaxial pattern.

4. The semiconductor device of claim 1, wherein the silicide gate electrode is a metal silicide layer.

5. The semiconductor device of claim 1, wherein the insulating spacer has a greater height than the first epitaxial pattern.

6. The semiconductor device of claim 1, further comprising an interlayer insulating layer that is disposed on the silicide source contact and the silicide drain contact and that extends into the insulating spacer.

7. The semiconductor device of claim 6, further comprising a first via that extends into the insulating spacer through the interlayer insulating layer and that is connected to the silicide gate electrode.

8. The semiconductor device of claim 6, further comprising:
   a second via that is connected to the silicide source contact through the interlayer insulating layer; and
   a third via that is connected to the silicide drain contact through the interlayer insulating layer.

9. The semiconductor device of claim 1, wherein the first epitaxial pattern has a greater height than the silicide gate electrode.

10. The semiconductor device of claim 1, wherein the second epitaxial pattern has a greater height than the silicide gate electrode.

11. A semiconductor device comprising:

a silicide gate electrode that is disposed over a substrate and that is a metal silicide layer;

an insulating spacer that surrounds a sidewall of the silicide gate electrode;

a first epitaxial pattern that is disposed on the substrate and that has a greater height than the silicide gate electrode;

a second epitaxial pattern that is disposed on the substrate and that has a greater height than the silicide gate electrode;

a silicide source contact that is disposed on the first epitaxial pattern; and a silicide drain contact that is disposed on the second epitaxial pattern, wherein the insulating spacer has a greater height than the silicide gate electrode, and wherein the insulating spacer has a greater height than at least one of the first epitaxial pattern and the second epitaxial pattern.

12. The semiconductor device of claim 11, wherein the silicide source contact is disposed at a level different from a top level of the silicide gate electrode.

13. The semiconductor device of claim 11, wherein the silicide drain contact is disposed at a level different from a top level of the silicide gate electrode.

14. The semiconductor device of claim 11, wherein an upper surface of the insulating spacer and an upper surface of the silicide source contact are disposed substantially at the same level.

15. The semiconductor device of claim 11, wherein the silicide gate electrode is a metal silicide layer.

16. A semiconductor device comprising:

a silicide gate electrode that is disposed over a substrate;

an insulating spacer that surrounds a sidewall of the silicide gate electrode;

a first epitaxial pattern that is disposed on the substrate and that has a greater height than the silicide gate electrode;

a second epitaxial pattern that is disposed on the substrate and that has a greater height than the silicide gate electrode;

a silicide source contact that is disposed on the first epitaxial pattern; and a silicide drain contact that is disposed on the second epitaxial pattern, wherein the insulating spacer has a greater height than the silicide gate electrode, the first epitaxial pattern, and the second epitaxial pattern.

17. The semiconductor device of claim 16, wherein the silicide gate electrode is a metal silicide layer.

\* \* \* \* \*